(12) United States Patent
Lee et al.

(10) Patent No.: US 7,786,494 B2
(45) Date of Patent: Aug. 31, 2010

(54) THIN FILM TRANSISTOR, METHOD OF MANUFACTURING THE SAME, ORGANIC LIGHT EMITTING DISPLAY APPARATUS COMPRISING THE THIN FILM TRANSISTOR, AND METHOD OF MANUFACTURING THE SAME

(75) Inventors: Hun-Jung Lee, Suwon-si (KR); Jae-Kyeong Jeong, Suwon-si (KR); Yeon-Gon Mo, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 89 days.

(21) Appl. No.: 12/149,944

(22) Filed: May 9, 2008

(65) Prior Publication Data

US 2008/0277658 A1 Nov. 13, 2008

(30) Foreign Application Priority Data

May 11, 2007 (KR) .................. 10-2007-0046224

(51) Int. Cl.
*H01L 29/18* (2006.01)

(52) U.S. Cl. ..................... 257/88; 257/72; 257/315; 257/369; 257/E21.414; 257/E29.151; 438/479; 438/149; 438/197; 438/159

(58) Field of Classification Search ............ 257/66, 257/88, 213, 76, 77, 72, 315, 369, E21.414, 257/E29.151; 438/479, 149, 197, 159
See application file for complete search history.

(56) References Cited

U.S. PATENT DOCUMENTS 5,536,953 A * 7/1996 Dreifus et al. ............... 257/77

(Continued)

FOREIGN PATENT DOCUMENTS

JP 2002-289859 10/2002
KR 2007-0035373 3/2007

OTHER PUBLICATIONS

Seong et al., "Comparison between ZnO films grown by atomic layer deposition using $H_2O$ or $O_3$ as oxidant", Thin Solid Films 478 (2005), 103-108.

(Continued)

*Primary Examiner*—Matthew Smith
*Assistant Examiner*—Wilner Jean Baptiste
(74) *Attorney, Agent, or Firm*—Robert E. Bushnell, Esq.

(57) ABSTRACT

A thin film transistor includes a gate electrode; an active layer formed of an oxide and insulated from the gate electrode; and a source electrode and a drain electrode formed of an oxide on the active layer such that the source electrode and the drain electrode are insulated from the gate electrode and electrically connected to the active layer, wherein the active layer, the source and the drain electrode are formed using an atomic layer deposition (ALD) and an insitu process, and a root mean square (RMS) value of the surface roughness of the active layer which contacts with the source and drain electrodes is less than 1 nm in order to reduce the contact resistance between the active layer and the source and drain electrodes, a method of manufacturing the same, an organic light emitting display apparatus including the thin film transistor, and a method of manufacturing the same.

21 Claims, 3 Drawing Sheets

U.S. PATENT DOCUMENTS

| | | | |
|---|---|---|---|
| 6,727,550 B2 * | 4/2004 | Tezuka et al. | 257/347 |
| 7,242,039 B2 * | 7/2007 | Hoffman et al. | 257/213 |
| 7,332,382 B2 * | 2/2008 | Han | 438/149 |
| 2002/0050599 A1 * | 5/2002 | Lee et al. | 257/88 |
| 2006/0255364 A1 | 11/2006 | Saxler et al. | |
| 2007/0257253 A1 * | 11/2007 | Im et al. | 257/40 |

OTHER PUBLICATIONS

Park et al., "Characteristics of ZnO Thin Films by Means of Plasma-Enhanced Atomic Layer Deposition", Electrochemical and Solid-State Letters, 9 (10) G299-301 (2006).

Korean Office action for Korean patent application No. 2007-0046224 issued on Feb. 29, 2008.

* cited by examiner

THIN FILM TRANSISTOR, METHOD OF MANUFACTURING THE SAME, ORGANIC LIGHT EMITTING DISPLAY APPARATUS COMPRISING THE THIN FILM TRANSISTOR, AND METHOD OF MANUFACTURING THE SAME

CLAIM OF PRIORITY

This application makes reference to, incorporates the same herein, and claims all benefits accruing under 35 U.S.C. §119 from an application for THIN FILM TRANSISTOR, METHOD OF MANUFACTURING THE SAME, ORGANIC LIGHT EMITTING DISPLAY APPARATUS COMPRISING THE THIN FILM TRANSISTOR, AND METHOD OF MANUFACTURING THE SAME earlier filed in the Korean Intellectual Property Office on 11 May 2007 and there duly assigned Serial No. 10-2007-0046224.

BACKGROUND OF THE INVENTION

1. Field of the Invention

The present invention relates to a thin film transistor, a method of manufacturing the same, an organic light emitting display apparatus including the thin film transistor, and a method of manufacturing the same, and more particularly, to a thin film transistor having reduced contact resistance between an active layer and source and drain electrodes, a method of manufacturing the same, an organic light emitting display apparatus including the thin film transistor, and a method of manufacturing the same.

2. Description of the Related Art

Recently, portable thin flat panel display devices have been widely used. Among the flat display devices, electroluminescent devices, which are self-emitting devices, have advanced characteristics such as wide viewing angle, excellent contrast, and shot response time, and thus are considered to be the next generation of display devices. Additionally, an organic light emitting display apparatus including an organic material forming a light emitting layer may form brighter images, and has lower operating voltage and shorter response time compared to an inorganic light emitting display apparatus. Furthermore, the organic light emitting display apparatus may realize multiple colors.

A flat panel display devices such as an organic light emitting display apparatus includes a plurality of pixels. A thin film transistor is used as an operating device to control operations of each of the pixels. The thin film transistor includes an active layer having a source/drain region and a channel region, a gate electrode corresponding to the channel region and a source/drain electrode corresponding to the source/drain region.

Since the active layer electrically contacts the source and drain electrodes, the contact resistance between the active layer and the source and drain electrodes is one of the critical factors that influences the electrical characteristics of the thin film transistor.

When the active layer and the source and drain electrodes are formed as thin films, however, the contact resistance may increase due to poor interface characteristics between the active layer and the source and drain electrodes, and thus the characteristics of the thin film transistor and the organic light emitting display apparatus including the thin film transistor may be decreased.

SUMMARY OF THE INVENTION

It is therefore an object of the present invention to provide an improved thin film transistor and a method of manufacturing the same, and an organic light emitting display apparatus including the think film transistor and a method of manufacturing the same in order to overcome the above statement problems.

It is another object of the present invention to provide a thin film transistor having reduced contact resistance between an active layer and source and drain electrodes by forming the active layer and the source an drain electrodes using an atomic layer deposition (ALD) and an insitu process, a method of manufacturing the same, and organic light emitting display apparatus including the thin film transistor, and a method of manufacturing the same.

According to an aspect of the present invention, there is provided a thin film transistor including a gate electrode; an active layer formed of an oxide and electrically insulated from the gate electrode; a source electrode and a drain electrode formed of an oxide on the active layer such that the source electrode and the drain electrode are electrically insulated from the gate electrode and electrically connected to the active layer; the active layer, the source and the drain electrode being formed using an atomic layer deposition (ALD) and an insitu process, and a root mean square (RMS) value of surface roughness of the active layer which contacts the source and drain electrodes being less than 1 nm, a method of manufacturing the same, an organic light emitting display apparatus including the thin film transistor, and a method of manufacturing the same.

The active layer and the source and drain electrodes may be formed of an oxide including Zn.

The oxide may include one compound selected from the group consisting of ZnSnO, ZnInO, ZnInGaO, and ZnSnGaO.

The concentration of the carrier in the active layer may be in the range of $1 \times 10^{14}$ cm$^{-3}$ to $1 \times 10^{15}$ cm$^{-3}$, and the concentration of the carrier in the source and drain electrodes may be in the range of $1 \times 10^{16}$ cm$^{-3}$ to $1 \times 10^{17}$ cm$^{-3}$.

According to another aspect of the present invention, there is provided an organic light emitting display apparatus including the transistor, and an organic electroluminescence device which is electrically connected to the thin film transistor.

According to another aspect of the present invention, there is provided a method of manufacturing a thin film transistor, the method including forming a gate electrode on a substrate; forming an active layer insulated from the gate electrode; and forming a source electrode and a drain electrode using an oxide on the active layer such that the source electrode and the drain electrode are insulated from the gate electrode and electrically connected to the active layer, wherein the active layer, the source electrode and the drain electrodes are formed using an atomic layer deposition (ALD) and an insitu process.

The temperature for forming the source and drain electrodes may be higher than the temperature for forming the active layer when the active layer and the source and drain electrode are sequentially formed using the ALD.

The steps of forming the active layer and forming the source and drain electrodes may include patterning the active layer, the source electrode and the drain electrode using a halftone mask at a time.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown.

Figure 1:
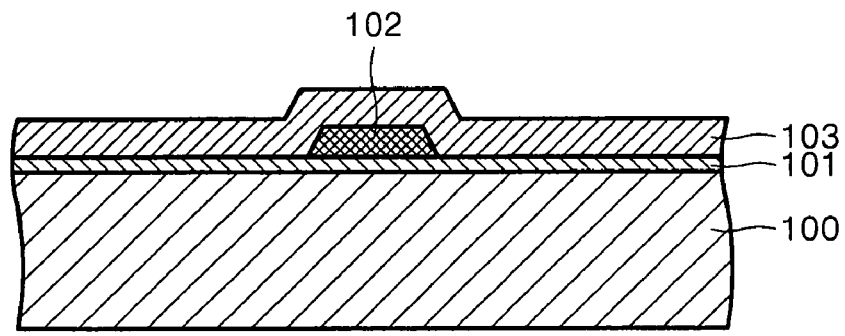
FIGS. 1 through 3 are cross-sectional views of a thin film transistor illustrating a method of manufacturing the thin film transistor constructed as an embodiment of the present invention.
Figure 2:
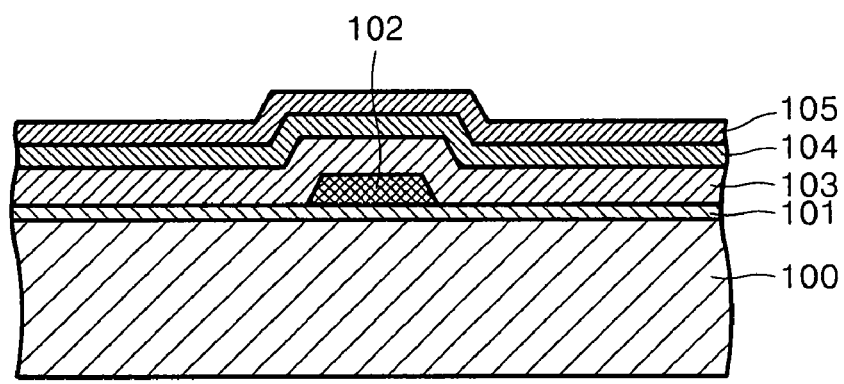
Figure 3:
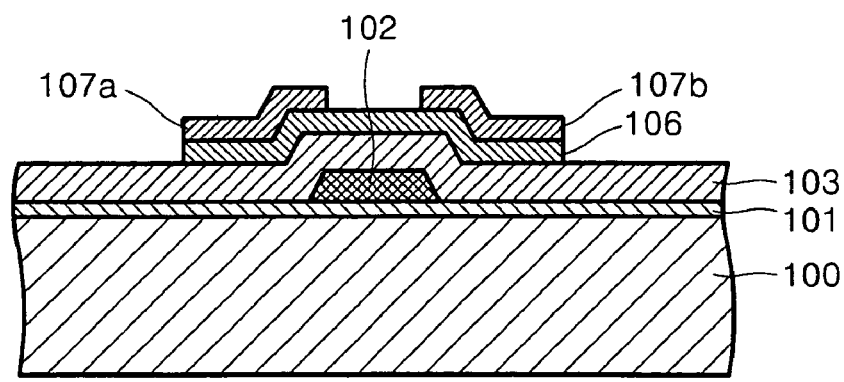

FIGS. 1 through 3 are cross-sectional views of a thin film transistor (TFT) illustrating a method of manufacturing the thin film transistor constructed as an embodiment of the present invention. The thin film transistor includes a gate electrode, an active layer, and a source and drain electrode.

The thin film transistor is formed on a substrate 100. Substrate 100 may be formed of a transparent glass material having $SiO_2$ as a main component, however, the present invention is not limited thereto, and substrate 100 may also be formed of a transparent plastic material. The plastic substrate may be formed of an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propinonate (CAP). Substrate 100 is not necessarily formed of a transparent material. Substrate 100 may also be formed of a metal. The metal for forming substrate 100 may be at least one of iron, chrome, manganese, nickel, titanium, molybdenum, stainless steel (SUS), an Invar alloy, a Inconel alloy, and a Kovar alloy, but the present invention is limited thereto. Substrate 100 may be formed of a metal foil.

A buffer layer 101 may be formed on the top surface of substrate 100 to insure flatness of substrate 100 and prevent impurity from permeating into substrate 100. Buffer layer 101 may be formed of $SiO_2$ and/or, SiNx, etc.

Referring to FIG. 1, gate electrode 102 and gate insulating layer 103 are formed on buffer layer 101. Gate electrode 102 is connected to a gate line (not shown) for applying on/off signals to the TFT. Gate electrode 102 may be formed of a metal such as Au, Ag, Cu, Ni, Pt, Pd, Al, and Mo, or an alloy such as Al:Nd, and Mo:W, but is not limited thereto.

Gate insulating layer 103 formed of $SiO_2$, SiNx, or the like is formed on the top surface of gate electrode 102. Gate insulating layer 103 may be formed of an inorganic material such as a metal oxide or a metal nitride or an organic material such as an insulating polymer.

Referring to FIG. 2, first oxide layer 104 and second oxide layer 105 are formed of a ZnO-based oxide disposed on gate insulating layer 103 in order to form an active layer 106, a source electrode 107a and a drain electrode 107b. First oxide layer 104 and second oxide layer 105 are formed of an atomic layer deposition (ALD) and an insitu process. In an insitu process, the active layer and the source/drain electrodes are completely fabricated in a single chamber without being moved to another chamber during the fabrication. Because the fabrication of the active layer and the source/drain electrodes is completed in a single chamber, no extra oxide may be formed on the active layer. Therefore, properties of the interface between the active layer and source/drain electrodes are improved and the surface roughness characteristic of the active layer is improved.

The ZnO-based oxide may include one compound of ZnSnO, ZnInO, ZnInGaO and ZnSnGaO. First oxide layer 104 and second oxide layer 105 may be formed of the same oxide or different oxides.

For example, first oxide layer 104 forming active layer 106 may include ZnInO, and second oxide layer 105 forming source electrode 107a and drain electrode 107b may include ZnInGaO. In order to obtain such structure, a Zinc source, an Indium source, and an Oxygen source are supplied at the beginning of the deposition to induce chemical reactions therebetween to form a layer including ZnInO. The sources may be simultaneously or independently supplied. Purging may be performed to remove remaining dispensable materials after the chemical reactions. After forming the layer including ZnInO, a Zinc source, an Indium source, a Gallium source, and an Oxygen source are supplied to induce chemical reactions therebetween to form a layer including ZnInGaO.

Since first oxide layer 104 and second oxide layer 105 are formed using the atomic layer deposition (ALD), they may be sequentially formed in one chamber using an insitu process.

Active layer 106 functions as semiconductor, and source electrode 107a and drain electrode 107b function as conductors, and thus the carrier concentration of each of the layers may be varied. That is, source electrode 107a and drain electrode 107b are required to have a relatively greater carrier concentration compared to active layer 106. For this, each of the carrier concentrations needs to be controlled when first oxide layer 104 and second oxide layer 105 are formed by using atomic layer deposition (ALD). The temperature is controlled when forming the thin film using the ALD to effectively control the concentration of the carrier. That is, the forming of first oxide layer 104 having a relatively lower carrier concentration is conducted at a high temperature, and the forming of second oxide layer 105 having a relatively high carrier concentration is conducted at a low temperature to effectively control the carrier concentration.

S. K. Kim et al. reported that the carrier concentration varies according to the temperature during forming ZnO thin film by using the ALD in the article "Comparison between ZnO films grown by atomic layer deposition using $H_2O$ or $O_3$ as oxidant", published on Thin solid dims 478 (2005) 103-108.

That is, the concentration of the carrier may be adjusted by controlling the temperature without injecting a dopant when forming ZnO thin film by using ALD.

The concentration of the carrier in active layer 106 may be adjusted to $1\times10^{14}$ $cm^{-3}$ to $1\times10^{15}$ $cm^{-3}$, and the concentration of the carrier in source electrode 107a and drain electrode 107b may be adjusted to $1\times10^{16}$ $cm^{-3}$ to $1\times10^{20}$ $cm^{-3}$ by controlling the temperature during forming active layer 106, source electrode 107a and drain electrode 107b by using the ALD.

When the concentration of the carrier in active layer 106 is adjusted to $1\times10^{14}$ cm$^{-3}$ to $1\times10^{15}$ cm$^{-3}$, conductivity and mobility of active layer 106 may fall into a range of those of semiconductor. Additionally, when the concentration of the carrier in source electrode 107a and drain electrode 107b is adjusted to $1\times10^{16}$ cm$^{-3}$ to $1\times10^{20}$ cm$^{-3}$, conductivity and mobility of source electrode 107a and drain electrode 107b may fall into a range of those of a metal.

Referring to FIG. 3, after first oxide layer 104 and second oxide layer 105 are formed by using the ALD, active layer 106, source electrode 107a, and drain electrode 107b are patterned by using photolithography.

After forming first oxide layer 104 and second oxide layer 105 using the ALD, active layer 106, source electrode 107a and drain electrode 107b may be patterned simultaneously using a halftone mask. Particularly, since active layer 106, source electrode 107a, and drain electrode 107b include a ZnO-based oxide, they may be easily patterned simultaneously. Active layer 106, source electrode 107a and drain electrode 107b may be formed by using one mask in a photolithography process, thereby reducing the number of process. As a result, the manufacturing costs and time may be reduced.

The characteristics of a thin film transistor are greatly influenced by the properties of the interface between the active layer and the source and drain electrodes. Particularly, the contact resistance of the active layer which contacts with the source and drain electrodes is one of the interface properties which affects electrical characteristics of the thin film transistor. In addition, the contact resistance of the active layer which contacts with the source and drain electrodes tends to be in proportion to the roughness of the surface of the active layer. Accordingly, it is critical to form a smooth surface of the active layer which contacts with the source and drain electrodes. The active layer is typically formed using sputtering, one of the methods of forming a thin film. The RMS (root mean square) value of surface roughness of the active layer may be greater than 3 nm when the active layer is formed of ZnO by using a sputtering process.

According to the present invention, however, active layer 106, source electrode 107a and drain electrode 107b are sequentially formed using the ALD and the insitu process. When the active layer is formed by using the ALD, the RMS value may be less than 1 nm. If a thin film is formed by using the ALD, a dense layer without pinning may be obtained even at a low temperature and uniform surface characteristics may be achieved.

Park et al. reported in "Characteristics of ZnO thin films by means of plasma-enhanced atomic layer deposition," Electrochemical and Solid-State Letters, 9, G209 (2006) that the RMS value of a ZnO film formed using the ALD may be less than 1 nm.

Further, when active layer 106 and source electrode 107a and drain electrode 107b which contact with active layer 106 are formed by using the ALD, the insitu process may be facilitated. Through the insitu process, the thin film transistor having improved surface roughness characteristics of active layer 106 which contacts with the source and drain electrodes may be formed.

Reduction in the surface roughness of active layer 106 may result in an improvement of the properties in the interface between active layer 106 and source and drain electrodes 107a and 107b. The improvement of properties of the interface results in reduction in the contact resistance in the interface between active layer 106 and source and drain electrodes 107a and 107b. The thin film transistor constructed as an embodiment of the present invention may improve electrical characteristics by reducing the contact resistance in the interface between active layer 106 and source and drain electrodes 107a and 107b.

Figure 4:
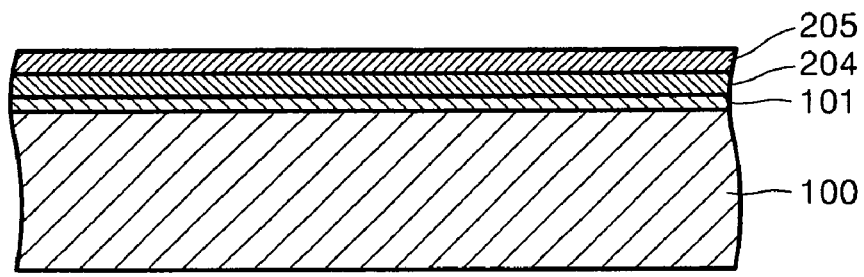
FIGS. 4 through 6 are cross-sectional views of a thin film transistor illustrating a method of manufacturing the thin film transistor constructed as another embodiment of the present invention.
Figure 5:
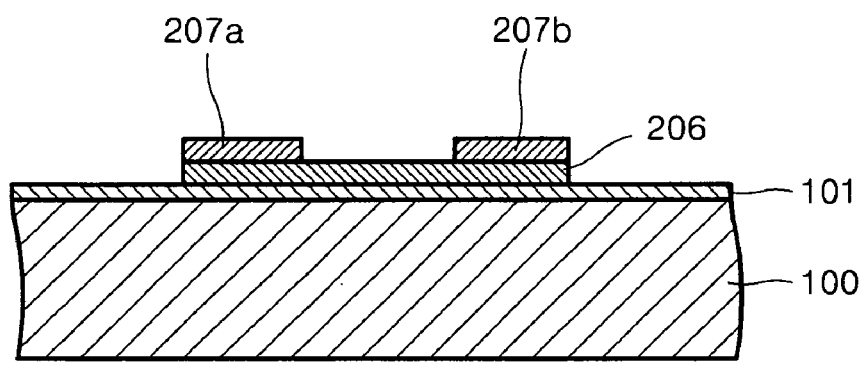
Figure 6:
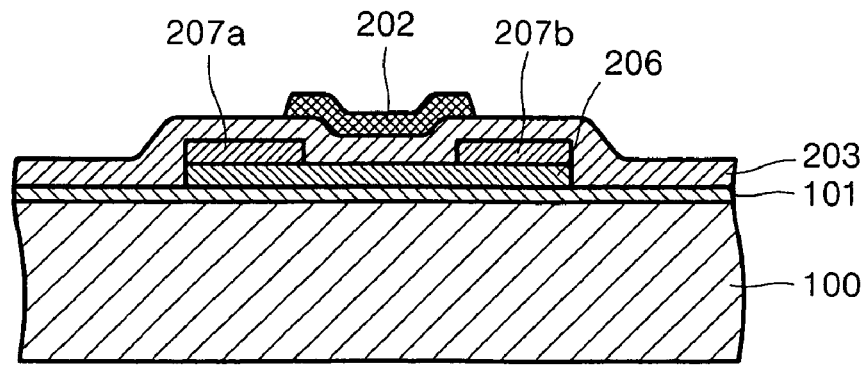

FIGS. 4 through 6 are cross-sectional views of a thin film transistor illustrating a method of manufacturing the thin film transistor according to another embodiment of the present invention. The thin film transistor will described with reference to the different features described above. The same reference numerals indicate the same elements.

The thin film transistor includes an active layer, a source and drain electrode, and a gate electrode.

The thin film transistor is formed on a substrate 100. A buffer layer 101 may be formed on substrate 100. Referring to FIG. 4, a first oxide layer 204 and a second oxide layer 205 are formed of a ZnO-based oxide on buffer layer 101 to form an active layer 206, a source electrode 207a and a drain electrode 207b. First oxide layer 204 and second oxide layer 205 are formed using an ALD and an insitu process.

The ZnO-based oxide may include one compound of ZnSnO, ZnInO, ZnInGaO, and ZnSnGaO. First oxide layer 204 and second oxide layer 205 may be formed of the same oxide or different oxides.

For example, first oxide layer 204 forming active layer 206 may include ZnInO, and second oxide layer 205 forming source electrode 207a and drain electrode 207b may include ZnInGaO. To obtain such structure, a Zinc source, an Indium source, and an Oxygen source are supplied at the beginning of the deposition to induce chemical reactions therebetween to form a layer including ZnInO. The sources may be simultaneously or independently supplied. Purging may be performed to remove remaining dispensable materials after the chemical reactions. After forming the layer including ZnInO, a Zinc source, an Indium source, a Gallium source, and an Oxygen source are supplied to induce chemical reactions therebetween to form a layer including ZnInGaO.

First oxide layer 204 and second oxide layer 205 may be sequentially formed in one chamber by using the ALD and the insitu process.

The concentration of the carrier in active layer 206 may be adjusted into a range of $1\times014$ cm$^{-3}$ to $1\times10^{15}$ cm$^{-3}$, and the concentration of the carrier in source electrode 207a and drain electrode 207b may be adjusted into a range of $1\times10^{16}$ cm$^{-3}$ to $1\times10^{20}$ cm$^{-3}$. For this, the temperature is controlled when first oxide layer 204 and second oxide layer 205 are formed using the ALD. The concentration of the carrier increases as the temperature increases when the thin film is formed using the ALD. Thus, the temperature when forming second oxide layer 205 forming source electrode 207a and drain electrode 207b is higher than that when forming first oxide layer 204 forming active layer 206.

Referring to FIG. 5, first oxide layer 204 and second oxide layer 205 are formed using the ALD, and then active layer 206, source electrode 207a, and drain electrode 207b are patterned using photolithography.

After forming first oxide layer 204 and second oxide layer 205 using the ALD, active layer 206, source electrode 207a and drain electrode 207b are patterned simultaneously using a halftone mask.

A gate insulating layer 203 may be formed using SiO$_2$, SiNx, or the like on source electrode 207a and drain electrode 207b to cover source electrode 207a and drain electrode 207b. Gate insulating layer 203 may be formed of an inorganic material such as a metal oxide or a metal nitride or an organic material such as an insulating polymer.

A gate electrode 202 is formed on gate insulating layer 203. Gate electrode 202 is connected to a gate line (not shown) applying on/off signals to the TFT. Gate electrode 202 may be formed of a metal such as Au, Ag, Cu, Ni, Pt, Pd, Al, and Mo, or an alloy such as Al:Nd, and Mo:W, but is not limited thereto.

As described in the previous embodiment, active layer 206, source electrode 207a, and drain electrode 207b may be sequentially formed by using the ALD and the insitu process. Accordingly, the surface roughness properties of active layer 206 which contacts with source electrode 207a and drain electrode 207b may be improved, thereby forming a thin film transistor having an RMS value of less than 1 nm. Reduction in the surface roughness of active layer 206 which contacts with source electrode 207a and drain electrode 207b results in improvement of the properties in the interface between active layer 206 and source and drain electrodes 207a and 207b. The improvement of properties of the interface results in reduction in the contact resistance in the interface between active layer 206 and source and drain electrodes 207a and 207b. As a result, the electrical characteristics of the thin film transistor may be improved.

FIG. 3 illustrates a thin film transistor having a bottom gate structure, and FIG. 6 illustrated a thin film transistor having a top gate structure. Such bottom gate structure and top gate structure are exemplary structures of the thin film transistor and the present invention is not limited thereto.

The thin film transistor according to an embodiment of the present invention may be used as an operating device which operates each pixel of a flat panel display device such as an organic light emitting display apparatus.

Figure 7:
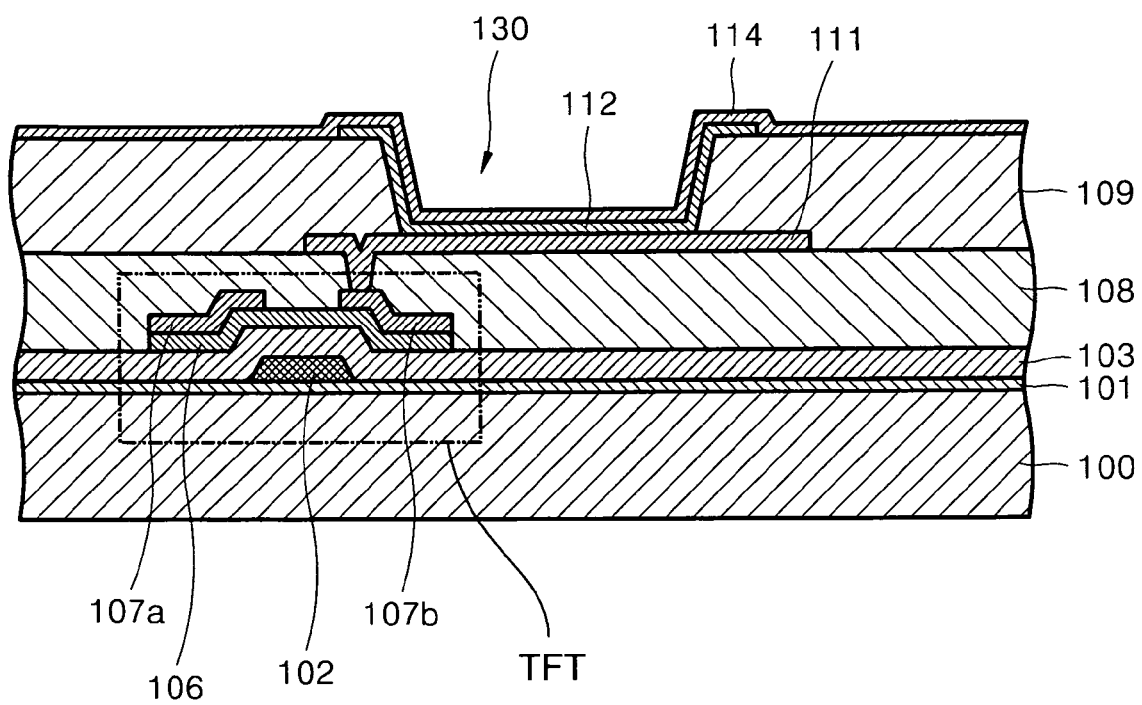
FIG. 7 is a cross-sectional view of an organic light emitting display apparatus including the thin film transistor illustrated in FIG. 3.

FIG. 7 is a cross-sectional view of an organic light emitting display apparatus including the thin film transistor illustrated in FIG. 3. FIG. 7 illustrates an active matrix (AM) type organic light emitting display apparatus according to an embodiment of the present invention.

As illustrated in FIG. 7, the organic light emitting display apparatus constructed as an embodiment of the present invention includes a substrate 100, and an organic light emitting device 130.

A thin film transistor (TFT) is formed on the top surface of substrate 100. At least one TFT are formed for each pixel and the TFT is electrically connected to organic light emitting device 130. The TFT is the one illustrated in FIG. 3. Descriptions of the same elements described above are omitted and the same reference numerals indicate the same elements.

A buffer layer 101 is formed on substrate 100, and a gate electrode 102 is formed on buffer layer 101. A gate insulating layer 103 is formed on gate electrode 102. An active layer 106, a source electrode 107a and a drain electrode 107b are formed on gate insulating layer 103.

A planarization layer 108 is formed on the top portion of source electrode 107a and drain electrode 107b to cover the thin film transistor. Planarization layer 108 may be an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, or the like, and the organic insulating layer may include a commercial polymer such as polymethyle methacrylate (PMMA) and polystyrene (PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer and a blend thereof. Planarization layer 108 may be a complex laminate including the inorganic and organic insulating layers.

A first electrode 111 which may be an anode electrode of organic light emitting device 130 is formed on the top portion of planarization layer 108, and a pixel define layer 109 is formed using an insulating material to cover first electrode 111. An opening is formed on pixel define layer 109, and then an organic light emitting layer 112 of organic light emitting device 130 is formed in a region restricted by this opening. Then, a second electrode 114, which may be a cathode electrode of organic light emitting device 130, is formed to cover all of the pixels. The electrical polarities of first electrode 111 and second electrode 114 may be reversed.

Organic light emitting device 130 which emits light according to current flow to display an image includes a first electrode 111, which is electrically connected to one of source and drain electrodes 107a/107b of the TFT through a contact hole, an organic light emitting layer 112, and a second electrode 114.

First electrode 111 may be patterned by using photolithography. The pattern of first electrode 111 may correspond to the pixel. Second electrode 114, which is formed on the top portion of first electrode 111, may be used as the cathode electrode by being connected to an external terminal (not shown). Second electrode 114 may be formed over the active region in which an image is realized. The electrical polarities of first electrode 111 and second electrode 114 may be reversed.

In a top emission type organic light emitting display apparatus, first electrode 111 may be a reflective electrode, and second electrode 114 may be a transparent electrode. The reflective electrode as first electrode 111 includes a reflective layer formed of Ag, Mg, Al, Pt, Pd, Au, Ni, Nd, Ir, Cr, Li, Ca, or a compound thereof. The transparent electrode as second electrode 114 may be formed by depositing a low work function metal such as Ag, Mg, Al, Pt, Pd, Au, Ni, Nd, Ir, Cr, Li, Ca or a compound thereof. An auxiliary electrode layer or a bus electrode line may be formed thereon using a transparent conductive material such as ITO, IZO, ZnO, or $In_2O_3$.

An organic light emitting layer 112 is interposed between first electrode 111 and second electrode 114. Organic light emitting layer 112 interposed between first electrode 111 and second electrode 114 emits light by electrical operations of first electrode 111 and second electrode 114. Organic light emitting layer 112 may be formed of a low molecular organic compound or a high molecular organic compound. When organic light emitting layer 112 is formed of a low molecular organic compound, a hole transport layer (HTL), a hole injection layer (HIL), and the like may be formed on organic light emitting layer 112 in a direction toward first electrode 111, and an electron transport layer (ETL), an electron injection layer (EIL), and the like may be formed on organic light emitting layer 112 in a direction toward second electrode 114. Besides, various layer may be formed as desired. Examples of the organic compound may include copper phthalocyanine (CuPc), N,N'-Di(naphthalene-1-yl)-N,N'-diphenyl-benzidine (NPB), tris-8-hydroxyquinoline aluminum (Alq3), and the like.

A sealing member (not shown), which seals organic light emitting device 130, is formed on organic light emitting device 130. The sealing member is formed to protect organic light emitting device 130 from external moisture or oxygen. In the top emitting structure as illustrated in FIG. 7, the sealing member may be a transparent material. The sealing member may be a glass substrate, a plastic substrate, or a piled structure of an organic compound and an inorganic compound.

In the present embodiment, the organic light emitting display apparatus includes the thin film transistor illustrated in FIG. 3, but it may include the thin film transistor illustrated in FIG. 6.

Although the present invention is directed to an organic light emitting display apparatus, the thin film transistor of the present invention may also be applied to other flat panel display devices such as liquid crystal displays.

The contact resistance between the active layer and the source and drain electrodes may be reduced by using the thin film transistor and the method of manufacturing the same and the organic light emitting display apparatus and the method of manufacturing the same according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor, comprising:
   a gate electrode;
   an active layer formed of an oxide and insulated from the gate electrode;
   a source electrode and a drain electrode formed of an oxide on the active layer such that the source electrode and the drain electrode are insulated from the gate electrode and electrically connected to the active layer; and
   the active layer, the source, and the drain electrode being formed using an atomic layer deposition (ALD) and an insitu process, and the root mean square (RMS) value of the surface roughness of the active layer which contacts with the source and drain electrodes being less than 1 nm.

2. The thin film transistor of claim 1, with the active layer and the source and drain electrodes being formed of an oxide comprising Zinc.

3. The thin film transistor of claim 2, with the oxide comprising one compound selected from a group consisting of ZnSnO, ZnInO, ZnInGaO and ZnSnGaO.

4. The thin film transistor of claim 1, in which the concentration of the carrier in the active layer is in a range of $1\times10^{14}$ cm$^{-3}$ to $1\times10^{15}$ cm$^{-3}$, and the concentration of the carrier in the source and drain electrodes is in a range of $1\times10^{16}$ cm$^{-3}$ to $1\times10^{20}$ cm$^{-3}$.

5. An organic light emitting display apparatus, comprising:
   a thin film transistor, comprising:
   a gate electrode;
   an active layer formed of an oxide and insulated from the gate electrode;
   a source electrode and a drain electrode formed of an oxide on the active layer such that the source electrode and the drain electrode are insulated from the gate electrode and electrically connected to the active layer; and
   the active layer, the source, and the drain electrode being formed using an atomic layer deposition (ALD) and an insitu process, and the root mean square (RMS) value of the surface roughness of the active layer which contacts with the source and drain electrodes being less than 1 nm; and
   an organic electroluminescence device being electrically connected to the thin film transistor.

6. The thin film transistor of claim 5, with the active layer and the source and drain electrodes being formed of an oxide comprising Zinc.

7. The thin film transistor of claim 6, with the oxide comprising one compound selected from a group consisting of ZnSnO, ZnInO, ZnInGaO and ZnSnGaO.

8. The thin film transistor of claim 6, in which the concentration of the carrier in the active layer is in a range of $1\times10^{14}$ cm$^{-3}$ to $1\times10^{15}$ cm$^{-3}$, and the concentration of the carrier in the source and drain electrodes is in a range of $1\times10^{16}$ cm$^{-3}$ to $1\times10^{20}$ cm$^{-3}$.

9. A method of manufacturing a thin film transistor, the method comprising:
   forming a gate electrode on a substrate;
   forming an active layer insulated from the gate electrode; and
   forming a source electrode and a drain electrode using an oxide on the active layer such that the source electrode and the drain electrode are insulated from the gate electrode and electrically connected to the active layer,
   wherein the active layer, the source electrode, and the drain electrodes are formed using an atomic layer deposition (ALD) and an insitu process.

10. The method of claim 9, in which the active layer and the source and drain electrodes are formed of a ZnO-based oxide.

11. The method of claim 10, in which the ZnO-based oxide comprises one compound selected from a group consisting of ZnSnO, ZnInO, ZnInGaO, and ZnSnGaO.

12. The method of claim 9, in which the concentration of the carrier in the active layer is in the range of $1\times10^{14}$ cm$^{-3}$ to $1\times10^{15}$ cm$^{-3}$, and the concentration of the carrier in the source and drain electrodes is in the range of $1\times10^{16}$ cm$^{-3}$ to $1\times10^{20}$ cm$^{-3}$.

13. The method of claim 9, in which a temperature of a process for forming the active layer is different from a temperature of a process for forming the source and drain electrodes.

14. The method of claim 9, in which the temperature during the forming of the source and drain electrodes is higher than that during the forming of the active layer while the active layer and the source and drain electrode are sequentially formed using the ALD.

15. The method of claim 9, in which the forming of the active layer and the forming of the source and drain electrodes comprises pattering simultaneously the active layer, the source electrode, and the drain electrode using a halftone mask.

16. A method of manufacturing an organic light emitting display apparatus, the method comprising:
   forming a thin film transistor by forming a gate electrode on a substrate; forming an active layer insulated from the gate electrode; forming a source electrode and a drain electrode using an oxide on the active layer such that the source electrode and the drain electrode are insulated from the gate electrode and electrically connected to the active layer, with the active layer, the source electrode, and the drain electrodes being formed using an atomic layer deposition (ALD) and an insitu process; and
   forming an organic electroluminescence device which is electrically connected to the thin film transistor.

17. The method of claim 16, in which the active layer and the source and drain electrodes are formed of a ZnO-based oxide.

18. The method of claim 17, in which the ZnO-based oxide comprises one compound selected from a group consisting of ZnSnO, ZnSnO, ZnInGaO, and ZnSnGaO.

19. The method of claim 16, in which the concentration of the carrier in the active layer is in the range of $1\times10^{14}$ cm$^{-3}$ to $1\times10^{15}$ cm$^{-3}$, and the concentration of the carrier in the source and drain electrodes is in the range of $1\times10^{16}$ cm$^{-3}$ to $1\times10^{20}$ cm$^{-3}$.

20. The method of claim 16, in which a temperature of a process for forming the active layer is different from a temperature of a process for forming the source and drain electrodes.

21. The method of claim 16, in which the temperature during the forming of the source and drain electrodes is higher than that during the forming of the active layer while the active layer and the source and drain electrode are sequentially formed using the ALD.

\* \* \* \* \*